United States Patent [19]
Nakasuji

[11] Patent Number: 6,087,046
[45] Date of Patent: Jul. 11, 2000

[54] METHODS FOR FORMING MICROLITHOGRAPHIC MASKS THAT COMPENSATE FOR PROXIMITY EFFECTS

[75] Inventor: Mamoru Nakasuji, Yokohama, Japan

[73] Assignee: Nikon Corporation, Tokyo, Japan

[21] Appl. No.: 09/060,892

[22] Filed: Apr. 15, 1998

[30] Foreign Application Priority Data

Apr. 16, 1997 [JP] Japan .................................. 9-099005

[51] Int. Cl.⁷ ..................................................... G03F 9/00
[52] U.S. Cl. ............................................... 430/5; 430/296
[58] Field of Search ................................. 430/5, 296, 394

[56] References Cited

U.S. PATENT DOCUMENTS 5,792,581  8/1998  Ohnuma ...................................... 430/5
5,804,339  9/1998  Kim ............................................ 430/5

OTHER PUBLICATIONS

Abe et al., "Representative Figure Method for Proximity Effect Correction [II]," *Jpn. J. Appl. Phys.* 30:2965–2969 (1991).
Parikh, "Corrections to Proximity Effects in Electron Beam Lithography. I. Theory," *J. Appl. Phys.* 50:4371–4377 (1979).

*Primary Examiner*—S. Rosasco
*Attorney, Agent, or Firm*—Klarquist Sparkman Campbell Leigh & Whinston, LLP

[57] ABSTRACT

Methods are disclosed for forming microlithography (photolithography or charged-particle-beam projection lithography) masks exhibiting reduced proximity effects. A first exposure is made, using an electron beam at a first exposure intensity level, on a mask substrate. The first exposure is made on region(s) of the mask substrate corresponding to the desired basic feature(s) of the mask pattern. A second exposure is made, using, the electron beam at a second exposure intensity level, at "secondary exposure regions" that at least partially reside within the basic feature (s). Thus, portions of the basic features receive a cumulative electron exposure that is greater than other portions of the basic features. Such increased cumulative exposure causes an alteration of the profile of the subject basic feature sufficient to cause the resulting modified basic feature to exhibit a reduced proximity effect. The secondary exposure areas are preferably square and/or rectangular, extending along one or more edges of the subject basic feature, and can overlap or not overlap the corresponding edge(s) of the basic feature. The width and exposure intensity levels for the secondary exposure areas are controlled to produce a mask pattern area with widened and outgrown areas of the basic features that compensate for the proximity effect.

19 Claims, 2 Drawing Sheets

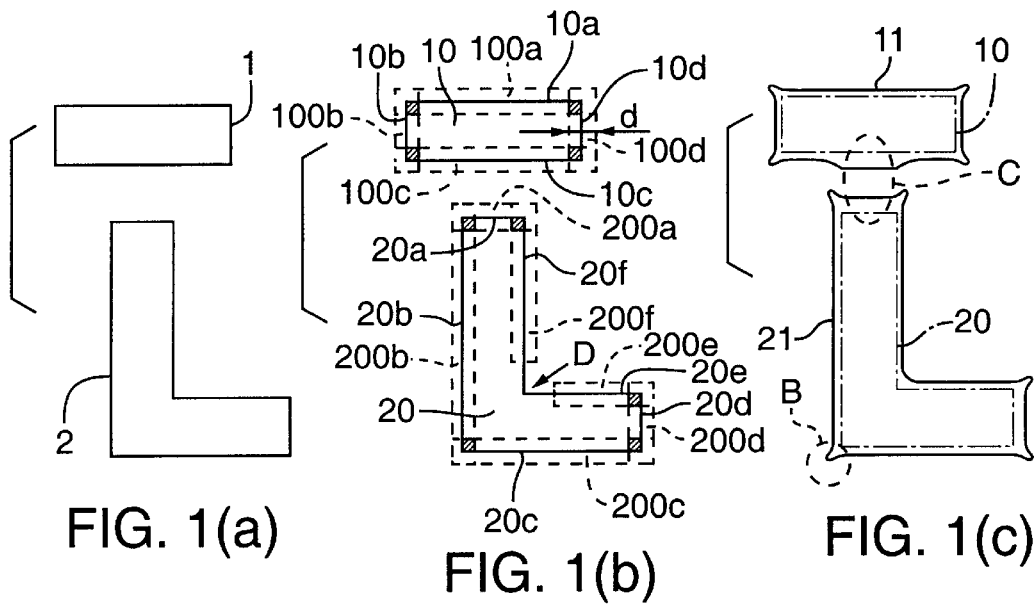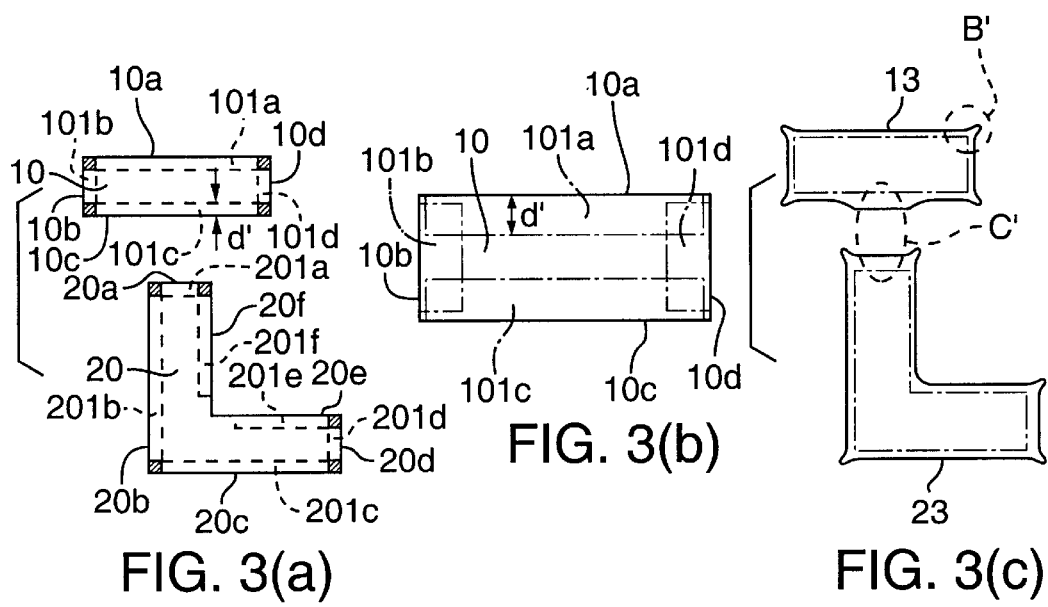

METHODS FOR FORMING MICROLITHOGRAPHIC MASKS THAT COMPENSATE FOR PROXIMITY EFFECTS

FIELD OF THE INVENTION

This invention pertains to methods for forming microlithographic (e.g., photolithographic or charged-particle-beam projection lithographic) masks for use in, e.g., manufacturing integrated circuits, displays, and the like. More specifically, the invention is directed to such methods employing an electron beam to inscribe the mask pattern.

BACKGROUND OF THE INVENTION

"Microlithography" encompasses several general methods, including "photolithography" (lithography employing light as an exposure medium) and "charged-particle-beam projection lithography" (lithography employing, e.g., an electron beam).

In photolithography, a light source directs light toward a mask to expose the mask pattern onto a sensitive substrate, such as a silicon wafer. The mask typically comprises a pattern of features defined in a chromium layer applied to a glass substrate. During use of the mask, light is illuminated onto the mask; regions of the mask in which no chromium is present transmit the incident light, and regions of the mask in which chromium is present reflect and/or absorb the incident light.

The pattern exposed on the wafer should ideally match the desired pattern as defined by the mask. For example, light passing through a mask feature having a rectangular profile should ideally form a corresponding feature having a rectangular profile on the wafer. However, when edges of adjacent mask features are in close proximity to each other, light passing through the mask in the vicinity of the edges is diffracted. The result of such diffraction and related effects is that the corresponding features formed on the wafer do not have the same profile of the corresponding features on the mask. For instance, the line width of an affected feature on the wafer may be narrower than expected based on the line width of the corresponding feature on the mask, and/or a corner of an affected feature on the wafer may be radiused while the corresponding feature on the mask has a sharp corner. This effect, known as the "optical proximity effect," can be especially problematic in high-density semiconductor devices.

There have been several methods proposed for reducing the optical proximity effect. For example, Haruki et. al., "Mask Pattern Correction Tool Using Genetic Algorithm," *Digest of Papers Microprocess '96* ($9^{th}$ International Microprocess Conference, 1996), p. 102, 1996, discloses a method in which the profiles of the features to be transcribed are altered. In the Haruki et al. method, the profile of individual features is altered by square and/or rectangular irregularities, such that the edges of individual features have "serifs". However, since the optical proximity effect often produces radiused corners in features that nominally should have sharp corners, the corrective precision of the Haruki et al. method is insufficient. Although designing the serif profiles is normally done using a computer, the calculations are time-consuming. Furthermore, the number of serifs that have to be transcribed is so high that pattern-delineation throughput tends to be very low.

In electron-beam or other charged-particle-beam projection lithography, proximity effects are also a serious problem. Such effects are caused by diffraction of the electron beam (or other charged-particle beam) around the edges of adjacent features on the mask. The general term "proximity effect" as used herein encompasses the optical proximity effect and proximity effects arising during use of a charged-particle beam.

SUMMARY OF THE INVENTION

In view of the foregoing shortcomings of conventional masks and of conventional methods for forming them, an object of this invention is to provide improved methods for forming microlithography masks (masks for, e.g., photolithography or charged-particle-beam projection lithography) using electron-beam delineation. A more specific object is to provide such methods that compensate for the proximity effect while maintaining good exposure precision.

Another object is to provide such methods that require less computational effort and time to determine appropriate altered feature profiles for compensating for the proximity effect.

An additional object is to provide such methods that provide an improved throughput compared to conventional methods for forming masks having altered feature profiles for compensating for the proximity effect.

A further object is to provide such methods that compensate for the proximity effect while maintaining good charged-particle-beam projection-exposure precision.

The invention is exemplified by several embodiments of methods for forming microlithography mask patterns using electron-beam delineation. The mask patterns formed according to the methods typically comprise conventional basic features that have been altered so as to compensate for the proximity effect. The exposure methods improve upon conventional mask forming techniques because the methods do not require a large number of calculations or elaborate beam tracing.

According to one aspect of the invention, exposure methods for forming microlithographic mask features are provided in which, for each of at least certain of the features, a primary exposure area on a mask substrate is inscribed using an electron beam at a first exposure intensity level to define the respective basic feature on the mask substrate. A secondary exposure area of the basic feature is then inscribed using an electron beam at a second exposure intensity level. The secondary exposure area extends along an edge of the basic feature so as to provide a cumulative electron exposure in the secondary exposure area that is greater than the cumulative electron exposure in a region of the basic feature not including the secondary exposure area. The secondary exposure intensity level is preferably lower than the first exposure intensity level. The size and shape of the secondary exposure area and secondary exposure level intensity are set so as to modify the profile of the basic feature in a manner that reduces the proximity effect that would otherwise be exhibited by the basic feature during use of the mask for microlithography.

According to a first representative embodiment, a primary exposure area on a mask substrate is inscribed using an electron beam at a first exposure intensity level to define a basic feature on the mask substrate. Secondary exposure areas of the basic feature are then inscribed using an electron beam at a second exposure intensity level that is preferably less than the first exposure intensity level. The secondary exposure areas have generally rectangular profiles extending along and overlapping corresponding edges of the basic feature. The secondary exposure areas are formed so that they overlap at external corners of the basic feature, and are foreshortened near internal corners of the basic feature. The width of the secondary exposure areas is preferably no more than one-half of the minimum width of the basic feature.

According to a second representative embodiment, a primary exposure area on a mask substrate is inscribed using an electron beam at a first exposure intensity level to define a basic feature on the mask substrate. Secondary exposure areas of the basic feature are then inscribed using an electron beam at a second exposure intensity level that is preferably less than the first exposure intensity level. The secondary exposure areas have generally rectangular profiles extending along corresponding edges of the basic feature so that the external edges of the secondary exposure areas are preferably coincident with the corresponding edges. The secondary exposure areas are formed so that they overlap at external corners of the basic feature, and are foreshortened near internal corners of the basic feature.

According to a third representative embodiment, a primary exposure area on a mask substrate is inscribed using an electron beam at a first exposure intensity level to define a basic feature on the mask substrate. Secondary exposure areas of the basic feature are then inscribed using an electron beam at second exposure intensity levels that can be varied for individual secondary exposure areas. The secondary exposure areas have generally square or rectangular profiles extending along and overlapping corresponding edges of the basic feature, with square areas at the external corners of the basic feature connected to rectangular areas along the edges of the basic feature. The secondary exposure areas are formed so that they are foreshortened near internal corners of the basic feature, and preferably are connected to each other but do not overlap. The secondary exposure intensity level of the square areas (corresponding to the external corners of the basic feature) can preferably be controlled separately from the secondary exposure intensity level of the rectangular areas.

In the exposure-method embodiments summarized above, the reduced exposure intensity level generally used while inscribing the secondary exposures areas can be produced by reducing the firing time of the electron-beam. The optimum values for the secondary exposure intensity levels and the widths of the secondary exposure areas for all of the exposure method embodiments can be determined through experimental trial or computer modeling.

The mask-formation methods of this invention advantageously do not require the extensive calculations and elaborate inscriptions required to form conventional serifs around the periphery of each basic feature of the mask pattern. The secondary exposure areas are preferably situated along corresponding edges of the basic features; the respective positions and shapes of the secondary exposure areas are easily ascertained from the basic feature data typically stored in a computer that controls electron-beam delineation. Additionally, the total number of secondary exposure areas is typically smaller than the total number of serifs that conventionally would be required to make a mask with a similar arrangement of basic features. Consequently, overall delineation throughput is improved.

The foregoing and additional features and advantages of the invention will be more readily apparent from the following detailed description, which proceeds with reference to the accompanying drawings.

BRIEF DESCRIPTION OF THE DRAWINGS

FIG. 1(a) is a plan view of representative features on a wafer.

FIG. 1(b) is a plan view showing how mask features similar to those shown in FIG. 1(a) are transcribed using an electron beam and using a method according to a first example embodiment of the invention.

FIG. 1(c) is a plan view showing the profiles of the mask features that result from using the method shown in FIG. 1(b).

FIG. 3(a) is a plan view showing how representative mask features are transcribed using an electron beam and using a method according to a second example embodiment of the invention.

FIG. 3(b) is an enlarged view of the feature 10 shown in FIG. 3(a).

FIG. 3(c) is a plan view showing the profiles of the features that result from using the method shown in FIG. 3(a).

DETAILED DESCRIPTION

Figure 2:
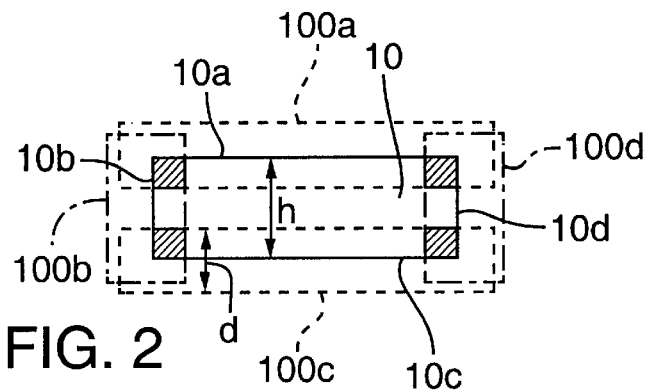
FIG. 2 is an enlarged plan view of the feature 10 shown in FIG. 1(b).

In methods for forming masks using electron-beam delineation, an electron beam is used to "write" (inscribe) a desired pattern onto a specially prepared substrate. A typical electron-beam-delineation process for making a mask is as follows. A surface of a glass or other suitable substrate is coated with a layer of chromium (or other suitable material that blocks transmission of the light with which the mask will used for microlithography) by a suitable process, such as deposition by sputtering. A resist layer is then applied superposedly on the chromium layer. The resist is specially formulated to be sensitive to electron exposure to selectively form areas that "resist" certain etching chemicals. A substrate (e.g., glass plate) with a layer of a light-blocking material and a layer of resist is termed herein a "mask substrate."

The mask substrate is placed in an exposure chamber where a computer-controlled electron beam is used to inscribe a desired mask pattern onto the resist. During delineation the electron beam inscribes specific areas on the resist. In the inscribed areas the electrons participate in a chemical reaction that breaks down the resist and allows the resist to be easily removed to expose the chromium. In the areas not exposed to the electron beam, the resist is unaffected and remains attached to the chromium. After electron-beam delineation, etching is performed using a chromium-etching chemical that removes the chromium in the exposed areas. The residual resist in the unexposed areas prevents the chemical from reaching the chromium. After etching is completed, the residual resist is chemically removed. The result is a chromium mask pattern etched onto the glass substrate suitable for microlithography.

By way of example, FIG. 1(a) shows a desired rectangular feature 1 on a wafer in close proximity to an "L"-shaped feature 2. It is desired to microlithographically expose (imprint) the features 1, 2 onto a sensitive substrate (e.g. silicon wafer) using a mask pattern defining "basic features" corresponding to the features 1, 2. As used herein, a "basic feature" is any feature on the mask having a profile corresponding to the respective feature, on a microlithographic substrate, that is ultimately desired. For example, the basic feature corresponding to a precisely rectangular feature on a microlithographic substrate is a rectangle.

In conventional methods of making a mask by electron-beam delineation, the electron beam is directed to produce a pattern in the mask comprising basic features that are similar to corresponding features of the desired wafer pattern. Thus, the electron beam is directed to inscribe respective basic features 10, 20 (FIG. 1(b)) in a mask. However, due to the proximity effect, the basic features 10, 20 on the mask tend to form corresponding features on the wafer that are different from (i.e., have a different profile than) the corresponding basic features on the mask.

Specifically, when the basic features 10, 20 are exposed onto a wafer by microlithography, adjacent edges of the corresponding features on the wafer tend to recede as a result of the proximity effect. This effect is particularly pronounced at external corners of the features on the wafer. If no compensation for the proximity effect is made, then the resulting pattern on the wafer will generally comprise features having radiused corners rather than sharp corners. Also, certain features on the wafer may be considerably narrowed and/or foreshortened compared to the corresponding basic features on the mask. The proximity effect tends to be pronounced along edges of features on the wafer that are in close proximity to one another.

To counter the proximity effect, the present invention provides electron-beam delineation methods for forming mask patterns having features that are widened and/or outgrown as required. The invention is described below in connection with multiple example embodiments that represent the current best mode of the invention.

For electron-beam projection, pattern deformation as shown in B may correct proximity effects. However, pattern deformation as shown in C may not be desirable. In such a situation, secondary exposure would not be indicated in the region 200a and corresponding portion of the region 200c.

EXAMPLE EMBODIMENT 1

A method according to this example embodiment forms a mask exhibiting reduced proximity effects. Features on the mask are formed using the following two-step exposure process, with reference to FIG. 1(b) and FIG. 1. During a first step, basic features 10, 20 having profiles corresponding to desired features to be formed on the wafer are inscribed on a mask substrate using an electron beam at a first exposure intensity level. During a second step, additional electron-beam inscriptions at a preferably reduced exposure intensity level are made in the peripheral regions 100a–100d and 200a–200f (the respective peripheral regions are enclosed by a dashed line in FIG. 1(b)). In general, the areas inscribed in the first step (i.e., the basic features) are termed "primary exposure areas", and the areas inscribed in the second step (e.g., the peripheral regions 100a–100d) are termed "secondary exposure areas." Portions of secondary exposure areas residing within the boundary of the corresponding basic feature receive a cumulative electron exposure that is greater than the cumulative electron exposure in other areas of the basic feature.

FIG. 2 is a detail of the upper feature shown in FIG. 1(b). In FIG. 2, the secondary exposure areas 100a and 100c are denoted by dashed lines and the secondary exposure areas 100b and 100d are denoted by dot-dash lines. (The position of each secondary exposure area has been slightly displaced in FIG. 2 to clarify overlapping regions.) The secondary exposure area 100a has a rectangular profile configured to overlap the edge 10a of the feature 10. Similarly, each of the secondary exposure areas 100b, 100c, 100d has a rectangular profile configured to overlap the edges 10b, 10c, 10d, respectively. Note that adjacent pairs of secondary exposure areas overlap in each of the "external corners" of the basic feature 10.

The basic feature 20 is also inscribed with secondary exposure areas 200a–200f, as shown in FIG. 1(b). However, the secondary exposure areas 200e, 200f do not overlap in the "internal corner" region, represented by the letter "D," of the basic feature 20. The dimension "h" (FIG. 2) represents the minimum line width of the basic features 10, 20 on the mask. In this example embodiment, each of the secondary exposure areas 100a–100d and 200a–200f has a width "d" (FIG. 2) that is equal to h/2. Generally, the maximum width "d" of the secondary exposure areas can be less than or equal to h/2.

During the first step, the primary exposure areas 10, 20 are inscribed at a "primary" exposure intensity level that, for convenience, is given a unitary (1.0) value. During the second step, the secondary exposure areas 100a–100d, 200a–200f are inscribed at a "secondary" exposure intensity level that is preferably less than the primary exposure intensity level (e.g., a level of 0.5, 0.4, or 0.3, etc., relative to unity). The lower secondary exposure intensity level can be obtained by reducing the electron-beam firing time (exposure time). The optimum exposure intensity level and secondary exposure area width settings depend upon many factors including the line-width of the basic features, the proximity of adjacent basic features, characteristics of the electron-beam exposure apparatus, properties of the resist such as thickness, etc. The optimal exposure-intensity level and width of the secondary exposure area can be determined experimentally by making a series of inscriptions while varying the exposure-intensity level and/or exposure width and comparing the resulting patterns formed from such test masks on test wafers, or by computer simulation.

FIG. 1(c) shows a mask pattern formed by performing electron-beam delineation as shown in FIG. 1(b). In FIG. 1(c), the dot-dot-dash line denotes the basic features 10, 20 (and thus primary exposure areas). By performing primary and secondary electron-beam exposure as described above, the peripheral edges of the basic features 10, 20 receive an increased cumulative electron exposure (except the internal corner of the basic feature 20 identified by the letter "D" in FIG. 1(b)). Such exposure increases feature width in selected areas as exemplified by the resulting modified features 11, 21 (FIG. 1(c)) on the mask. In addition, the shaded areas in FIG. 1(b) and FIG. 2 are regions where secondary exposure areas overlap and thus receive a cumulative electron exposure that is greater than non-overlapping regions of the secondary exposure areas. Such increased electron exposure results in localized corner outgrowths in each feature, as exemplified by the area "B" in FIG. 1(c).

Such inscription also produces widening of the features 11, 21 in adjoining regions, as denoted by the area "C." This widening is caused by an "electron-beam proximity effect." I.e., during electron-beam delineation, most of the electrons in the irradiating beam end up very near their respective intended target positions. However, due to forward scattering and back-scattering, of electrons, some of the electrons end up in adjacent areas. The magnitude of the electron-beam proximity effect is primarily dependent upon the nearness of previously inscribed areas to each other. As a result, adjacent mask features in close proximity to each other are generally widened in proximal regions of the features. The electron-beam proximity effect also causes widening and rounding of internal corners, as exemplified by the radiused internal corner of the modified feature 21 (FIG. 1(c)). Thus, it is not necessary to perform additional exposure of the area indicated by the letter "D" in FIG. 1(b) since the edges 20e, 20f are in close proximity to each other.

EXAMPLE EMBODIMENT 2

FIGS. 3(a)–3(c) illustrate an exposure method according to this example embodiment. FIG. 3(a) and FIG. 3(c) are analogous to FIG. 1(b) and FIG. 1(c), respectively. FIG. 3(b) is analogous to FIG. 2.

As with Example Embodiment 1, primary exposures are performed first using an electron beam to inscribe the basic features 10, 20. Afterward, secondary exposures are made. The locations of the secondary exposure areas in this example embodiment differ slightly from the locations of the secondary exposure areas of Example Embodiment 1. Specifically, the secondary exposure areas in this example embodiment are located inside the respective basic features 10, 20, as shown in FIG. 3(a). Each of the secondary exposure areas 101a–101d and 202a–201f preferably has a width d'. The secondary exposure areas 101a–101d and 202a–201f receive an increased cumulative electron exposure, and the external corners of each feature 10, 20 (identified by the shaded areas) represent areas where secondary exposure areas overlap and thus receive a further increased cumulative electron exposure. The resulting features formed by such an electron-beam delineation scheme have modified profiles 13, 22, as shown in FIG. 3(c). As with Example Embodiment 1, the width d' and the exposure intensity levels for the secondary exposure areas can be determined by experimental trial or computer modeling.

EXAMPLE EMBODIMENT 3

Figure 4:
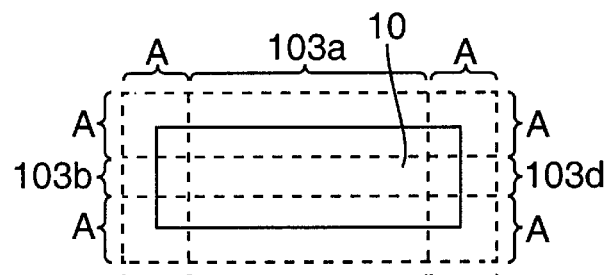
FIG. 4 is a plan view showing how a representative mask feature is transcribed using an electron beam and using a method according to a third example embodiment of the invention.

FIG. 4 shows a representative mask feature made according to the method of this example embodiment. FIG. 4 is analogous to FIG. 2 of Example Embodiment 1. In Example Embodiment 1, the secondary exposure areas overlapped at the external corners of the basic features 10, 20. In Example Embodiment 3, there is no overlap of secondary exposure areas at the external corners of the basic features. Specifically, as shown in FIG. 4, one group of secondary exposure areas comprises the approximately square external corner areas each having a side designated by "A." Between the external corner areas are the additional secondary exposure areas 103a–103d each extending along a corresponding edge of the basic feature 10, but not overlapping the external corner areas A. Similarly, the external corner areas of other basic features (e.g., basic feature 20 shown in FIG. 3(a)) are separate from other secondary exposure areas. Since the external corner areas and other secondary exposure areas 103a–103d are separate from one another, the exposure intensity level for these secondary exposure areas can be set independently as required and need not be equal to each other. This method of delineation has the advantage of allowing the exposure intensity level for any of various secondary exposure areas to be independently set according to the local degree of proximity effect. The optimum exposure intensity levels for the secondary exposure areas can be determined by experimental trial or computer modeling.

EXAMPLE EMBODIMENT 4

Figures 5A, 5B, 5C:
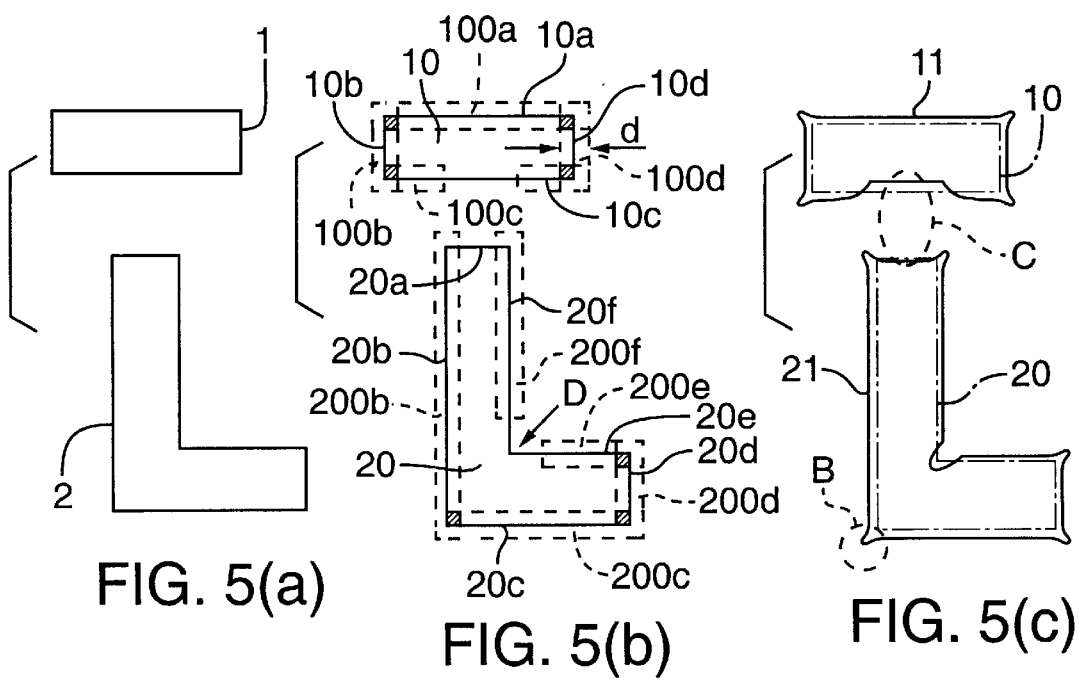
FIG. 5(a) is a plan view, with respect to the fourth example embodiment, of representative mask features on a wafer.
FIG. 5(b) is a plan view showing how mask features similar to those shown in FIG. 5(a) are delineated using an electron beam and using a method according to the fourth example embodiment.
FIG. 5(c) is a plan view showing the profiles of the features that result from using the method shown in FIG. 5(a).

FIGS. 5(a)–5(c) illustrate an exposure method according to this example embodiment. This method provides good correction of proximity effects in electron-beam projection lithography.

As with Example Embodiment 1, primary exposures are performed first using an electron beam to inscribe the basic features 10, 20. Afterward, secondary exposures are made. The locations of the secondary exposure areas in this example embodiment differ slightly from the locations of the secondary exposure areas of Example Embodiment 1. Specifically, in Example Embodiment 1 (FIG. 1(c)), the edges of adjacent features 11, 21 located within the circle C appear to extend toward each other, thereby narrowing the space between the features 11, 21. To prevent such narrowing, secondary exposure is not made in regions where the terminus of one feature extends toward an adjacent nearby feature. Thus, the secondary exposure area 100c is smaller in FIG. 5(b) than in FIG. 1(b) (i.e., in FIG. 5(b), the secondary exposure area 100c is not coextensive with the entire edge 10c). Also, the secondary exposure area 200a in FIG. 1(b) is absent in FIG. 5(b). The result of such a scheme is shown in FIG. 5(c), indicating a greater distance between the features 11, 21 than shown in FIG. 1(c). Thus, in FIG. 5(c), the edges of the features 11, 21 did not become closer to each other due to secondary exposure, and, after use of the mask of FIG. 5(c) in electron-beam projection lithography, the pattern shown in FIG. 5(a) is obtained.

Whereas the present invention has been described in connection with several preferred embodiments, it will be understood that the invention is not limited to these embodiments. On the contrary, the invention is intended to cover all alternatives, modifications, and equivalents as may be included within the spirit and scope of the invention as defined in the appended claims.

What is claimed is:

1. A method for forming a microlithography mask using electron-beam delineation, comprising the steps:
   (a) inscribing a primary exposure area on a mask substrate using an electron beam at a first exposure intensity level to define a basic feature on the mask substrate, the basic feature having a first edge and a second edge that intersect at an external corner of the basic feature; and
   (b) inscribing a secondary exposure area of the basic feature using the electron beam at a second exposure intensity level, the secondary exposure area having a first portion extending along the first edge of the basic feature and at least partially overlapping the basic feature along the first edge, and having a second portion extending along the second edge of the basic feature and at least partially overlapping the basic feature along the second edge, so as to provide a cumulative electron exposure, at least in regions of the secondary exposure area that overlap the basic feature, that is greater than the cumulative electron exposure in a region of the basic feature not including a secondary exposure area, wherein the secondary exposure area includes the external corner so as to form a localized outgrowth of the basic feature at the external corner.

2. The method of claim 1, wherein the secondary exposure area is within the basic feature.

3. The method of claim 2, wherein the basic feature coincides with respective outer edges of the secondary exposure area.

4. The method of claim 1, wherein the first and second portions of the secondary exposure area overlap the entire respective first and second edges.

5. The method of claim 1, wherein the secondary exposure area extends around the periphery of the basic feature.

6. The method of claim 1, wherein a portion of the secondary exposure area including the external corner receives a cumulative electron exposure greater than other portions of the secondary exposure area extending along the first and second edges.

7. The method of claim 1, wherein a portion of the secondary exposure area including the external corner receives a cumulative electron exposure that is equal to portions of the secondary exposure area extending along the first and second edges.

8. The method of claim 1, wherein:

the basic feature has a minimum linewidth h; and at least one portion of the secondary exposure area has a width d, wherein $d \leq h/2$.

9. The method of claim 1, wherein the secondary exposure area extends along a selected edge of the basic feature.

10. The method of claim 1, wherein secondary exposure is performed with respect to basic features having a line width narrower than a predetermined value.

11. A microlithographic mask formed by the method of claim 1.

12. A method for forming a microlithography mask using electron-beam delineation, the method comprising the steps:

(a) performing a first exposure of the electron beam on a mask substrate to form a basic feature of a mask pattern on the mask substrate at a uniform first exposure intensity level, the basic feature having a profile in which a first edge and a second edge intersect at an external corner of the basic feature, the external corner being situated adjacent a neighboring basic feature of the mask pattern; and (b) performing a second exposure of the electron beam on the mask substrate in a secondary exposure area, associated with the basic feature, at a second exposure intensity level, the secondary exposure area having a first square or rectangular portion extending along the first edge of the basic feature and a second square or rectangular portion extending along the second edge of the basic feature, the first and second portions meeting at the external corner in a manner serving to modify, after the second exposure, the profile of the external corner so as to produce a localized outgrowth of the external corner that reduces a proximity effect exhibited by the basic feature with the neighboring basic feature during use of the mask for microlithography using light or a charged-particle beam.

13. The method of claim 12, wherein the first and second edges of the basic feature coincide with respective outer edges of the secondary exposure area.

14. The method of claim 12, wherein, in step (b), a second exposure is performed at each of multiple secondary exposure areas of the basic feature, wherein adjacent secondary exposure areas overlap at a respective external corner of the basic feature.

15. The method of claim 12, wherein:

the basic feature comprises an internal corner; and in step (b), the second exposure is performed at each of multiple secondary exposure areas of the basic feature that do not overlap at the internal corner.

16. The method of claim 15, wherein the electron exposure intensity level at the separate secondary exposure area including the external corner is different than the electron exposure intensity level at other secondary exposure areas of the basic feature.

17. The method of claim 12, wherein each portion of the secondary exposure area overlaps the corresponding edge of the basic feature.

18. The method of claim 12, wherein each portion of the secondary exposure area is within the basic feature.

19. A microlithographic mask formed by the method of claim 12.

* * * * *

UNITED STATES PATENT AND TRADEMARK OFFICE
CERTIFICATE OF CORRECTION

PATENT NO. : 6,087,046
DATED : July 11, 2000
INVENTOR(S) : Mamoru Nakasuji

It is certified that error appears in the above-identified patent and that said Letters Patent is hereby corrected as shown below:

In Column 4, line 42, "will used" should be --will be used--.

In Column 5, line 49, "FIG. 1." should read --FIG. 2.--.

Signed and Sealed this

Eighth Day of May, 2001

Attest:

NICHOLAS P. GODICI

Attesting Officer     Acting Director of the United States Patent and Trademark Office